(12) United States Patent
Masuda et al.

(10) Patent No.: US 6,503,364 B1
(45) Date of Patent: Jan. 7, 2003

(54) PLASMA PROCESSING APPARATUS

(75) Inventors: Toshio Masuda, Toride (JP); Tatehito Usui, Niihari (JP); Shigeru Shirayone, Ebina (JP); Kazue Takahashi, Kudamatsu (JP); Mitsuru Suehiro, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 75 days.

(21) Appl. No.: 09/651,720

(22) Filed: Aug. 30, 2000

(30) Foreign Application Priority Data

Sep. 3, 1999 (JP) ............................. 11-250156

(51) Int. Cl.[7] ............................. C23C 16/00; C23F 1/02
(52) U.S. Cl. ............................. 156/345.24; 156/345.42; 156/345.46; 156/345.49; 118/712; 118/723 MA; 118/723 MR
(58) Field of Search .................. 118/723 MA, 723 MR, 118/712; 156/345

(56) References Cited

U.S. PATENT DOCUMENTS 6,051,120 A * 4/2000 Kishida et al. ........ 204/298.04

FOREIGN PATENT DOCUMENTS

| EP | 0 867 254 A1 | | 9/1998 |
|---|---|---|---|
| EP | 0 867 913 A1 | * | 9/1998 |
| JP | 63-128632 | * | 6/1988 |
| JP | 1-232725 | * | 9/1989 |
| JP | 8-111403 | * | 4/1996 |
| JP | 9-199476 | * | 7/1997 |
| JP | 9-330917 | * | 12/1997 |
| JP | 11-28583 | | 2/1999 |
| JP | 11-267859 | | 10/1999 |

* cited by examiner

*Primary Examiner*—Gregory Mills
*Assistant Examiner*—Luz L. Alejandro
(74) *Attorney, Agent, or Firm*—Antonelli, Terry, Stout & Kraus, LLP

(57) ABSTRACT

In the plasma processing apparatus for generating plasma in a processing chamber and processing a wafer by mutual action of electromagnetic waves radiated from a UHF band antenna installed in the processing chamber and a magnetic field formed by a magnetic field generator installed around the processing chamber, a hollow tube having one end in communication with an opening in the side wall of the processing chamber and another end, outside the processing chamber, which has a measuring window of plasma optical emission. By setting the lines of force of the magnetic field formed by the magnetic field generator so as to form an angle relative to the hollow tube, entry of plasma into the hollow tube can be prevented, and adhesion of deposits onto the measuring window can be suppressed, whereby the transmission factor of the measuring window can be kept constant over a long period of use.

7 Claims, 4 Drawing Sheets

PLASMA PROCESSING APPARATUS

BACKGROUND OF THE INVENTION

The present invention relates to a plasma processing apparatus and, more particularly, to a plasma processing apparatus which is capable of forming a fine pattern during semiconductor manufacture. More particularly, the invention relates to a window for measuring optical emission in a processing chamber.

During semiconductor manufacture, for fine processing, such as etching, film forming, and ashing, a plasma processing apparatus is widely used. Among them, there is an etching apparatus which converts process gas introduced into a vacuum chamber (reactor) to plasma using a plasma generation means, causes the plasma to react on the semiconductor wafer surface, executes fine processing, and also performs a predetermined etching process by exhausting volatile reaction products.

In this plasma etching apparatus, the optical emission intensity of specific radicals or ions is measured for plasma optical emission generated by etching of a wiring layer or insulating film; and, for example, the end point of the etching process is detected from a change with time of the optical emission intensity during the etching process. The radical composition is determined from the dependency of the optical emission intensity of the radical species on the process parameter so as to construct the process, and changes in the plasma chemistry are monitored.

However, when the etching process of a wafer is actually repeated over a period of several hours to several tens of hours, reaction products and a part of the process gas gradually adhere to the inner surface of the window for plasma optical emission measurement, and so the transmission factor of the measurement window is reduced. Therefore, problems arise in that the end point detection accuracy is reduced and the radical composition cannot be monitored accurately.

As a countermeasure for this problem, in Japanese Patent Application Laid-open 8-111403, an arrangement is described in which a detection window for plasma optical emission is installed at the top of a cylindrical hollow support portion; and, hence, adhesion of reaction products onto the inner surface of the detection window is suppressed, whereby an etching apparatus for stably determining the end point of etching over a long period of time is achieved. In Japanese Patent Application Laid-open 9-199476, an etching apparatus is described wherein, in the same way as with the aforementioned patent application, a cylindrical light guide is used, and a detection window for plasma optical emission is installed at the end thereof. More particularly, the length of the light guide is set to 10 times or more of the inner diameter; and, furthermore, inactive gas is introduced into the light guide, and the inside of the light guide is positively pressured, so that adhesion of reaction products is suppressed.

In Japanese Patent Application Laid-open 9-330917, a method is proposed in which some non-through holes are installed in a detection window in a block-type shape, and an end point detector is installed at the position opposite to the bottom thereof. Furthermore, Japanese Patent Application Laid-Open 1-232725 describes a method in which a heater is installed in a detection window, and the window portion is heated, so that adhesion of reaction products is suppressed. Also, Japanese Patent Application Laid-open 63-128632 describes a method in which, when a magnetic field is applied by a coil installed around an intermediate cylinder attached to a light measuring window, reaction products and ions are deflected and prevented from adhering to the light measuring window.

However, the aforementioned methods cannot completely suppress the reduction of the transmission factor of the optical emission measuring window, and so a problem arises in that the detection intensity of optical emission reduces gradually. For example, in the method using the non-through holes described in Japanese Patent Application Laid-open 9-330917, although the reduction of the transmission factor is suppressed more than that of other methods, data showing that the detection intensity is reduced to less than about 50% for about 10 hours of discharge is available.

Also, in Japanese Patent Application Laid-open 9-199476 mentioned above, it is indicated that, when the length of the light guide is set to 10 times or more of the inner diameter, the deposition amount of reaction products on the optical emission measuring window is reduced to $\frac{1}{10}$ or less compared with a case in which the length is 5 times or less of the inner diameter. Also, in this case, the deposition amount is not reduced to zero and the detection intensity reduces with the progress of time. In this patent application, it is also described that, when an inactive gas of positive pressure (for example, 101 mTorr for a processing pressure of 100 mTorr) is introduced into the light guide, reaction products find it hard to enter inside the light guide. When the processing pressure is 100 mTorr or more, the gas flow is in the area of viscous flow; and, furthermore, the mean free path of molecules is 1 mm or less, so that the molecules are discharged before they can adhere to the inner wall of the light guide, and an effect that the molecules do not easily enter the light guide can be expected to some extent. However, as the process is refined, the processing pressure is reduced to several Pa or less (several tens mTorr or less), and, in this pressure area, the flow is a molecular flow, so that an effect of discharge by the gas flow cannot be expected. Since the mean free path of molecules becomes longer, such as several mm to several tens mm, it may be considered that the probability of arrival of reaction products at the detection window is increased, and the deposition amount on the measuring window is increased.

Furthermore, in the method which calls for installing a heater on the end point detection window and heating the window portion, it becomes necessary to separately add a heating device and a safety mechanism in the etching apparatus; and, in the method for deflecting reaction products and ions using a magnetic field, a coil for generating the magnetic field is required separately, and both methods resultantly cause a complication of the apparatus and an increase in cost, and hence they are not practical. In the method which calls for using a magnetic field, the magnetic field causes disturbance of the plasma. Furthermore, in these methods, the effects of heating and the use of a magnetic field are not indicated quantitatively and are not clear.

Each of the aforementioned considerations relates to end point detection, but it is also desirable to detect dynamic intensity changes during processing, so that a gradual decrease of the transmission factor for many hours disturbs the signal detection very little. However, for example, when changes in the radical composition under a continuous discharge test are to be monitored, when the transmission factor of the measuring window reduces, the apparent detection intensity reduces and changes cannot be monitored accurately, so that it is necessary to measure the radical optical emission intensity without being adversely affected by such a disturbance factor.

Particularly, when a silicon oxide film is to be etched using a CF babies etching gas, such as $C_4F_8$, radical optical emission of CF and $CF_2$, which are etchants, is important for the process characteristics. However, the optical emission of them is in the area within the range of the peak wave length from 200 nm to 300 nm, and, in this area, the transmission factor of the measuring window is reduced greatly by the deposited film of the CF series, so that the reduction in the optical emission detection intensity appears more remarkably. As a result, without being adversely affected by the reduction in the transmission factor due to adhesion of the deposited film on the measuring window, it is necessary to measure plasma optical emission stably over a long period of time.

SUMMARY OF THE INVENTION

The present invention is intended to solve the aforementioned problems and to provide a plasma processing apparatus which is capable of suppressing adhesion and deposition of reaction products and etching gas onto the inner surface of a plasma optical emission measuring window and of measuring plasma optical emission stably for many hours.

The inventors examined the aforementioned problems, and, as a result, found that by attaching a measuring window of plasma optical emission at the outside end of a hollow tube having an inner diameter of 4 mm and a length of about 200 mm installed at an opening in the side wall of the processing chamber and forming a magnetic field in the neighborhood of the inlet of the hollow tube, so that the lines of magnetic force form an angle relative to the hollow tube, for example, by forming an angle of about 30 degrees to 45 degrees, plasma can be prevented from entering inside the hollow tube and deposits can be prevented almost completely from adhering onto the measuring window. The present invention have experimentally ascertained that by this method, the transmission factor of the measuring window is not reduced with time, and plasma optical emission can be measured stably and accurately over a long period of time, such as 100 hours of discharge and much longer, such as 1000 hours of discharges.

The present invention was developed on the basis of the aforementioned information and is intended to provide a plasma processing apparatus structured so as to feed process gas into the vacuum processing chamber, generate a plasma using a plasma generation device having a magnetic field system, perform the plasma process for a sample using the plasma, and measure optical emission of the plasma via the measuring window made of a transparent material. The present invention is characterized in that at the outside end of a hollow tube installed at an opening in the side wall of the processing chamber and extending in the outer direction, a measuring window of plasma optical emission is installed, and the magnetic field formed by the magnetic field forming means of the plasma generation device is formed in the neighborhood of the opening forming the inlet of the hollow tube, so that the lines of magnetic force form an angle relative to the axis of the hollow tube.

As will be described later, adhesion of a deposited film is assisted and promoted by the plasma, so that by use of such a constitution as described above, entry of plasma into the hollow tube can be prevented and adhesion of deposits onto the measuring window can be prevented almost completely. As a magnetic field, the magnetic field formed by the magnetic field forming means of the plasma generation device is used as it is, so that there is no need to install a mechanism for generating a local magnetic field in the neighborhood of the hollow tube. Therefore, the apparatus constitution can be simplified, and the magnetic field generated by the local magnetic field generation device will not cause a disturbance to plasma.

Another characteristic of the present invention is that, in the plasma generation device, the inner diameter D of the hollow tube is set within the range from 2 mm to 10 mm and the length L is set within the range from 50 mm to 250 mm. In this case, the operating pressure is, for example, within the range from 0.5 Pa to 4 Pa or so, and the inner diameter D of the hollow tube is on the order smaller than or almost equal to the mean free path $\lambda$ of molecules, while the length L of the hollow tube is sufficiently larger than the mean free path $\lambda$ of molecules, so that molecules adhere in the neighborhood of the inlet of the hollow tube by mutual action with the inner wall, and the probability of their arrival at the optical emission measuring window is reduced. Furthermore, by the synergistic effect with plasma entry prevention into the hollow tube by the magnetic field, adhesion of a deposited film onto the optical emission measuring window can be prevented almost completely.

Still another characteristic of the present invention is that, in the plasma generation device, the magnetic field formed in the neighborhood of the opening of the processing chamber or the inlet of the hollow tube has a magnetic flux density of 60 gauss or more. Since the magnetic field intensity is more than this value, the effect of plasma entry prevention into the hollow tube by the magnetic field appears remarkably, and adhesion of a deposited film onto the optical emission measuring window can be prevented almost completely.

A further characteristic of the present invention is that the plasma generation device is of the type having a magnetic field UHF band electromagnetic wave radiation and discharge system. In this case, the magnetic field formed by the magnetic field forming means of the plasma generation device has a magnetic flux density of about 160 gauss, and the lines of magnetic force and the hollow tube form an angle of 30 degrees to 45 degrees, so that entry of plasma into the hollow tube can be prevented effectively.

According to the present invention, at the outside end of the hollow tube installed at the opening in the side wall of the processing chamber, the measuring window of plasma optical emission is attached, and the magnetic field is formed in the neighborhood of the inlet of the hollow tube, so that the lines of magnetic force form an angle relative to the hollow tube, and, hence, entry of plasma into the hollow tube can be prevented. Since adhesion of deposits is promoted by the plasma, by preventing plasma from diffusing in the neighborhood of the measuring window, adhesion of deposits onto the measuring window can be prevented almost completely. When the inner diameter D of the hollow tube is made on the order smaller than or almost equal to the mean free path $\lambda$ of molecules, while the length L of the hollow tube is made sufficiently larger than the mean free path $\lambda$ of molecules, the probability of the arrival of molecules at the measuring window is reduced, so that by a synergistic effect with the magnetic field, plasma optical emission can be measured over a long period of many hours stably and accurately, unless the transmission factor of the measuring window reduces with time.

DETAILED DESCRIPTION OF PREFERRED EMBODIMENTS

Various embodiments of the present invention will be explained hereunder with reference to the accompanying drawing.

Figure 1:
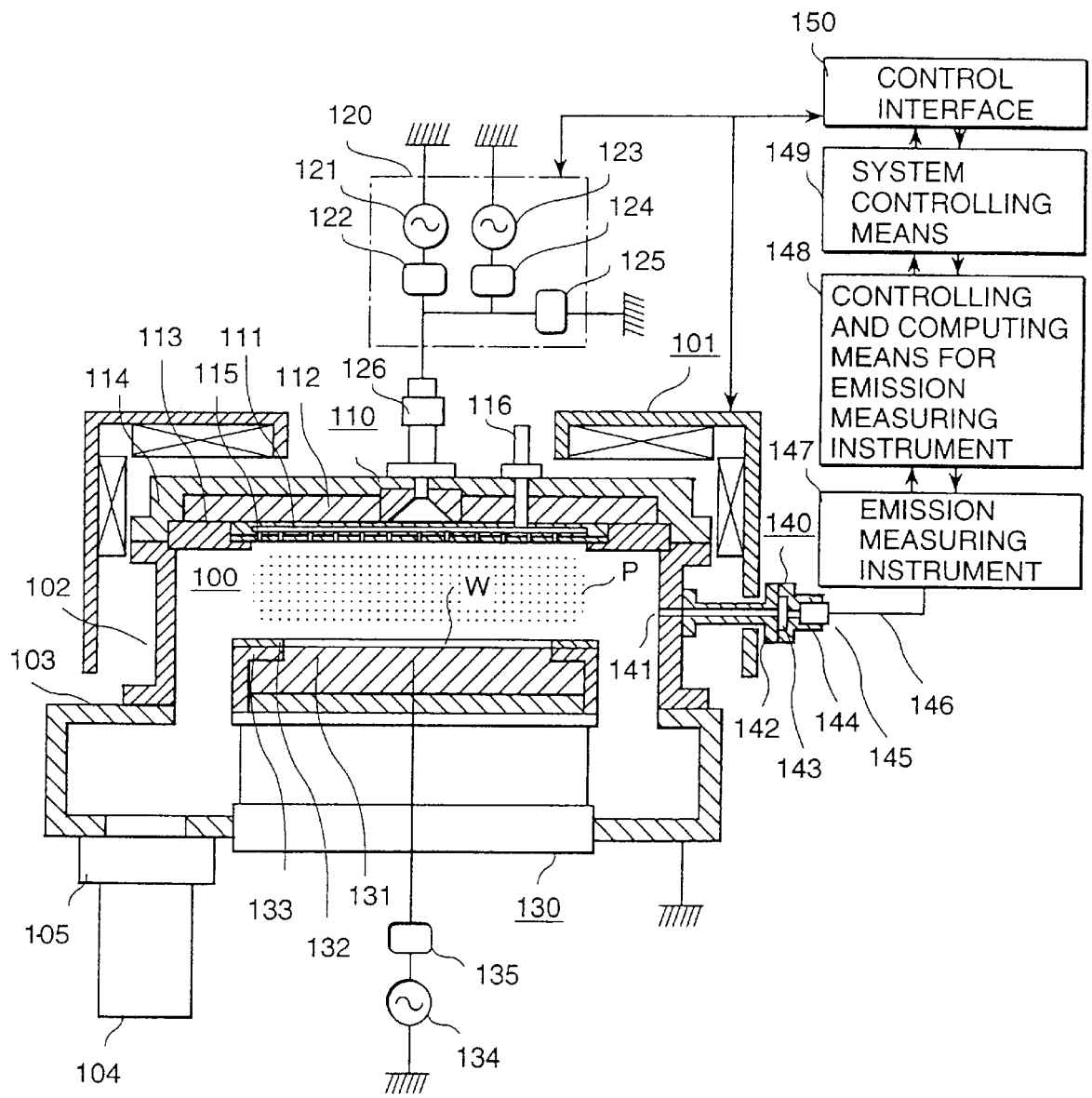
FIG. 1 is a cross-sectional schematic view of a plasma etching apparatus representing an embodiment of the present invention.

FIG. 1 shows an embodiment in which the present invention is applied to a plasma etching apparatus of the type having a magnetic field UHF band electromagnetic wave radiation-discharge system.

In FIG. 1, a processing chamber 100 is a vacuum container which can realize a degree of vacuum of about $10^{-6}$ Torr, and on the top thereof, an antenna 110 for radiating electromagnetic waves as a plasma generation means is installed, while at the bottom thereof, a lower electrode 130 for mounting a sample W, such as a wafer, is installed. The antenna 110 and the lower electrode 130 are installed so as to be disposed opposite to and in parallel with each other. Around the processing chamber 100, for example, a magnetic field forming means 101 composed of an electromagnetic coil and a yoke is installed, and a magnetic field having a predetermined distribution and intensity is generated thereby. By the mutual action of the electromagnetic waves which radiate from the antenna 110 and the magnetic field formed by the magnetic field forming means 101, process gas introduced into the processing chamber is converted to plasma, so as to generate plasma P, and the sample W is processed. The processing chamber 100 is subject to evacuation and pressure adjustment by an evacuation system 104 and a pressure control means 105, which are connected to a vacuum chamber 103, and the inner pressure can be preferably controlled to a predetermined value within the range from 0.5 Pa to 4 Pa. The processing chamber 100 and the vacuum chamber 103 are at the ground potential. A side wall 102 of the processing chamber 100 is controlled to, for example, about 50° C. by a temperature control means not shown in the drawing.

The antenna 110 for radiating electromagnetic waves is composed of a circular conductor 111, a dielectric 112, and a dielectric ring 113, and these elements are held by a housing 114, which forms a part of the vacuum container. On the surface of the circular conductor 111 on the side in contact with the plasma, a plate 115 is installed. Process gas for performing the processes for etching of a sample and film forming is fed from a gas feed means 116 at a predetermined flow rate and mixing ratio and is fed to the processing chamber 100 via many holes formed in the circular conductor 111 and the plate 115. To the antenna 110, an antenna power system 120, composed of an antenna power source 121, an antenna bias power source 123, and matching circuit-filter systems 122, 124, and 125, is connected via a leading-in terminal 126. The antenna power source 121 desirably feeds power at a UHF band frequency within the range from 300 MHz to 900 MHz and radiates electromagnetic waves of the UHF band from the antenna 110. The antenna bias power source 123 applies a bias voltage, for example, at a frequency of about 100 kHz or within the range from several MHz to about 10 MHz to the plate 115 via the circular conductor 111 and controls the reaction on the surface of the plate 115. Particularly, in the etching of an oxide film using a CF series gas, by using high-purity silicone or carbon as a material of the plate 115, the reaction of the F radical and CFx radical on the surface of the plate 115 is controlled and the radical composition ratio is adjusted. The distance from the bottom of the plate 115 to the wafer W (hereinafter called a gap) is from 30 mm to 150 mm, and more desirably from 50 mm to 120 mm. According to this embodiment, the antenna power source 121 is set at a frequency of 450 MHz and the antenna bias power source 122 is set at a frequency of 13.56 MHz.

On the bottom of the processing chamber 100, the lower electrode 130 is installed opposite to the antenna 110. The lower electrode 130 mounts and holds the sample W, such as a wafer, on the top thereof, that is, on the sample mounting surface, by use of an electrostatic adsorption device 131. On the outer periphery of the sample W, a sample stage 132 is installed on an insulator 133. To the lower electrode 130, a bias power source 134 for supplying bias power within the range from 400 kHz to 13.56 MHz is connected via a matching circuit-filter system 135 and controls the bias voltage to be applied to the sample W. According to this embodiment, the bias power source 134 is set at a frequency of 800 kHz.

Next, a plasma optical emission measuring unit 140, which is an essential part of this embodiment, will be explained. Plasma optical emission is measured via an opening 141 installed in the side wall 102 of the processing chamber 100. At the opening 141, a hollow tube 142 is attached so as to extend outside the housing, and on the other end thereof, a measuring window 143 of plasma optical emission, which is made of a transparent material, such as quartz, is attached. Optical emission from the plasma is led to a optical emission measuring device 147 by an optical fiber 146 via an optical fiber receptor 145 attached to a fiber holder 144. The optical emission measuring device 147 is controlled by an optical emission measuring device controlling-and-outputting means 148, which is connected to a high-order system control means 149. The system control means 149 controls the whole system by monitoring the condition of the whole apparatus system via a control interface 150.

The optical fiber receptor 145 is attached so as to be almost coaxial with the hollow tube 142 and the opening 141. To the fiber holder 144, a simple alignment mechanism for axial adjustment may be attached. It is desirable to position the opening 141 in a place at a distance of, for example, 5 mm to 30 mm or so above the sample W so as to detect changes in the chemistry, such as the radial composition in the neighborhood of the surface of the sample W. The material of the hollow tube 142 is desirably a metal, for example, Alumite-treated aluminum or stainless steel. The inner diameter D of the hollow tube 142 is 2 mm to 10 mm and the length L thereof is 50 mm to 250 mm. The values of inner diameter and length are set according to the relationship with the mean free path of the molecules. According to this embodiment, the operating pressure in the processing chamber is about 0.5 Pa to 4 Pa and the mean free path λ of molecules is about 5 mm to 30 mm (Ar molecules at 25° C.), so that the values of D/λ and L/λ are about 0.1 to 2 and about 2 to 50, respectively. Namely, the inner diameter D of the hollow tube is on the order smaller than or almost equal to the mean free path λ of the molecules, while the length L of the hollow tube is set sufficiently larger than the mean free path λ of the molecules. When the length L is set like this, molecules adhere in the neighborhood of the inlet of the hollow tube 142 by the mutual action with the inner wall at a remarkably higher probability than that of arrival at the measuring window 143, so that the probability of their arriving at the measuring window 143 is reduced. To develop such a mechanism effectively, it is desirable to set L/D to a value having a certain magnitude, and L/D=10 or so is not sufficient, and it is suitable to set L/D to 25 to 50 or so. Furthermore, according to this embodiment, by the synergistic effect with plasma entry prevention by the electromagnetic field, adhesion of a deposited film onto the measuring window 143 can be suppressed almost completely. When the hollow tube is made excessively long, the detection intensity of plasma optical emission received by the optical emission measuring device 147 is decreased, and it also may be considered that the SIN ratio of a signal is reduced. When the length L is about 50 mm to 250 mm, optical emission can be measured at a sufficient SIN ratio. In this embodiment, the use of one hollow tube is indicated. However, needless to say, a constitution in which, for example, a plurality of hollow tubes are tied up in a bundle, or a plurality of hollows arb formed in one tube and the detection S/N ratio is increased is, can be adopted as well.

The plasma etching apparatus according to this embodiment is structured as mentioned above, and a concrete process when, for example, a silicon oxide film is to be etched using this plasma etching apparatus, is described below.

Firstly, the wafer W which is an object to be processed, is transferred into the processing chamber 100 from a sample transfer mechanism that is not shown in the drawing; and, the wafer is then mounted and chucked on the lower electrode 130, the height of the lower electrode is adjusted as required and a predetermined gap is set. Then, the processing chamber 100 is evacuated by the evacuation system 104, and, on the other hand, gas necessary for the etching process of the sample W, for example, $C_4F_8$, Ar, and $O_2$ are fed to the processing chamber 100 from the plate 115 of the antenna 110 by the gas feed means 117 at a predetermined flow rate and mixing ratio, for example, 400 sccm of Ar, 15 sccm of $C_4F_8$, and 5 sccm of $O_2$. At the same time, the inside of the processing chamber 100 is adjusted to a predetermined processing pressure, for example, 2 Pa. On the other hand, by the magnetic field forming means 101, an almost horizontal magnetic field of about 160 gauss, which is equivalent to the electron cyclotron resonance magnetic field intensity for a frequency of 450 MHz of the antenna power source 121, is formed in the neighborhood of the lower part of the antenna 111. UHF band electromagnetic waves are radiated from the antenna 110 by the antenna power source 121 and plasma P is generated in the processing chamber 100 by the mutual action with the magnetic field. By the plasma P, process gas is dissociated, and radicals and ions are generated; and, furthermore, the antenna high frequency power source 121 and the bias power source 122 are controlled, and the etching process is performed for the wafer W. When the etching process is finished, the feed of the power and process gas are stopped and the etching process is finished. Plasma optical emission during the process is measured by the optical emission measuring device 147; and, on the basis of optical emission measured results, for example, the calculation process, such as end point detection, is performed by the optical emission device control-calculation means 148, and the results are transferred to the high order system control means 149; whereby the whole apparatus system is controlled.

Figure 2:
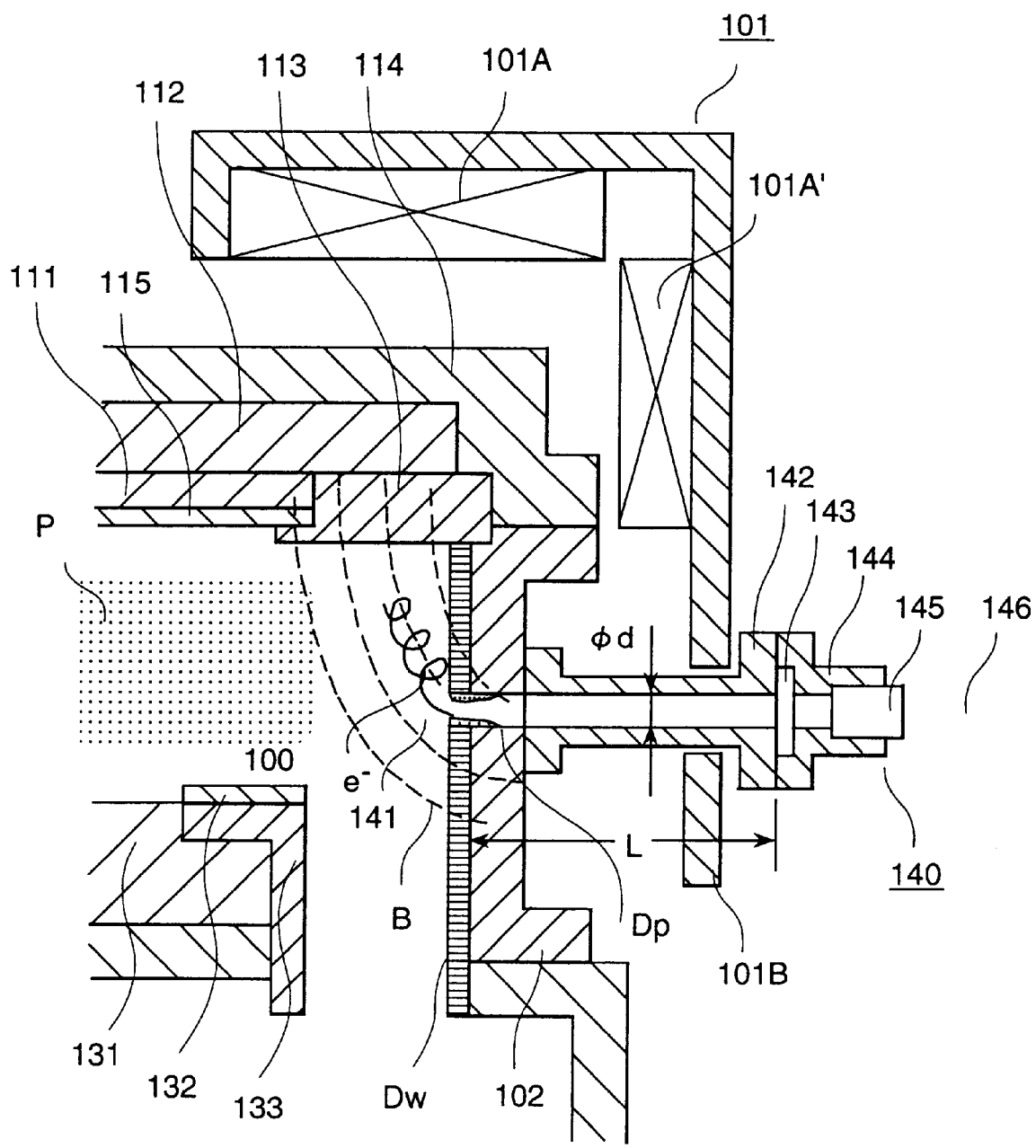
FIG. 2 is a cross-sectional view showing a mechanism for suppressing adhesion of deposits onto an optical emission measuring window in a plasma etching apparatus representing an embodiment of the present invention.

Next, a mechanism for suppressing adhesion of deposits onto the optical emission measuring window 143 in the plasma processing apparatus in this embodiment will be explained with reference to FIG. 2. FIG. 2 is an enlarged view of the neighborhood of the optical emission measuring device 140 and shows the situation of the lines of magnetic force in the area of the opening 141 and the adhesion condition of deposits at the same time. As explained with reference to FIG. 1, around the processing chamber 100, the magnetic field forming means 101 composed of electromagnetic coils 101A and 101A' and a yoke 101B is installed, and an almost horizontal magnetic field of about 160 gauss (electron cyclotron resonance magnetic field intensity for a frequency of 450 MHz of the antenna power source) is formed in the neighborhood of the lower part of the antenna 111. In this case, the lines of magnetic force are distributed from the electromagnetic coil 101A toward the lower part of the yoke 101B, as shown by dotted lines B in the drawing, and they form an angle from about 30 degrees to 45 degrees relative to the side wall in the neighborhood of the opening 141.

In this case, electrons in the plasma, as shown by $e^-$ in the drawing, move with a spiral cyclotron motion so as to roll in along the lines of magnetic force. Electrons moving in the neighborhood of the opening 141 arrive at the wall surface on the bottom of the opening 141 or the hollow tube 142 and disappear in the plasma. Therefore, the plasma suddenly reduces in density in the neighborhood of the opening 141 or in the neighborhood of the inlet of the hollow tube 142 and will not enter inside the hollow tube 142. Since the opening 141 and the lines of magnetic force form an angle like this, plasma is restricted in the neighborhood of the inlet of the opening by the magnetic field and is prevented from diffusing into the hollow tube. As will be described later, adhesion of a deposited film is assisted and promoted by the plasma, so that deposited films Dw and Dp adhere on the inner surface of the side wall 102 and in the neighborhood of the inlet of the hollow tube 142, though no deposited film is formed inside the hollow tube where plasma does not enter. Accordingly, no deposited film adheres onto the measuring window 143. It is desirable to use quartz having a high transmission factor of up to a short wave length in the neighborhood of 200 nm for the measuring window. However, particularly in etching of an oxide film, there is the possibility that the quartz may be etched and consumed and the surface may become rough. However, in this embodiment, since plasma does not enter inside the hollow tube 142, it does not come in contact with the measuring window 143, and, hence, the measuring window 143 will not be consumed.

Figure 3:
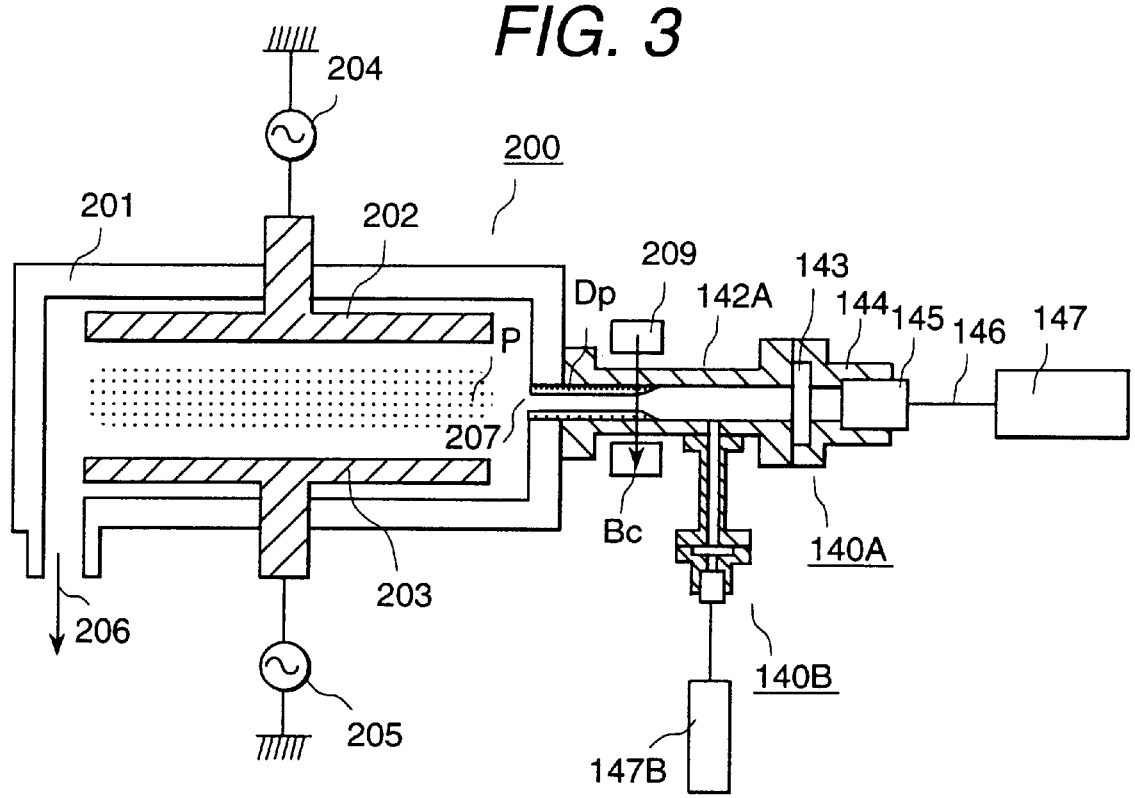
FIG. 3 is a cross-sectional view of an experimental device for examining prevention results of plasma diffusion into a hollow tube by a magnetic field and prevention effects of reduction in the transmission factor of a measuring window by a magnetic field, which are essential points of the present invention.

Next, with respect to the effect of plasma diffusion prevention into the hollow tube by the magnetic field and the effect of adhesion suppression of deposits onto the measuring window, results that have been experimentally obtained will be examined. FIG. 3 shows a schematic view of the apparatus used in the experiment. The experiment was executed using a non-magnetic field parallel plate type plasma apparatus 200.

A processing chamber 201, which is evacuated by an exhaust system 206, has an upper electrode 202 and a lower electrode 203, and a high frequency power source 204 and a bias power source 205 are connected to them, respectively, so that plasma P is generated. In an opening 207 installed in the side wall portion of the processing chamber 201, a plasma optical emission measuring unit 140A having the same constitution as that shown in the embodiment in FIG. 1 is installed. Furthermore, on the side wall of a hollow tube 142A, a plasma optical emission measuring unit 140B also having the same constitution as that shown in the embodiment in FIG. 1 is installed.

In the neighborhood of the inlet of the hollow tube 142, a local magnetic field generation device 209 is installed, so that a magnetic field Bc is generated perpendicularly to the hollow tube 142, and the optical emission intensity of the plasma diffused inside the hollow tube 142A, when the magnetic field intensity is changed, is measured by an optical emission measuring device 147B. The reason why a non-magnetic field parallel plate type plasma device 200 which is different from the one shown in the embodiment in FIG. 1, is used is that, in the magnetic field type plasma device, the participation of the magnetic field to plasma generation and the effect of plasma diffusion prevention at the entry to the hollow tube cannot be distinguished easily.

Figure 4:
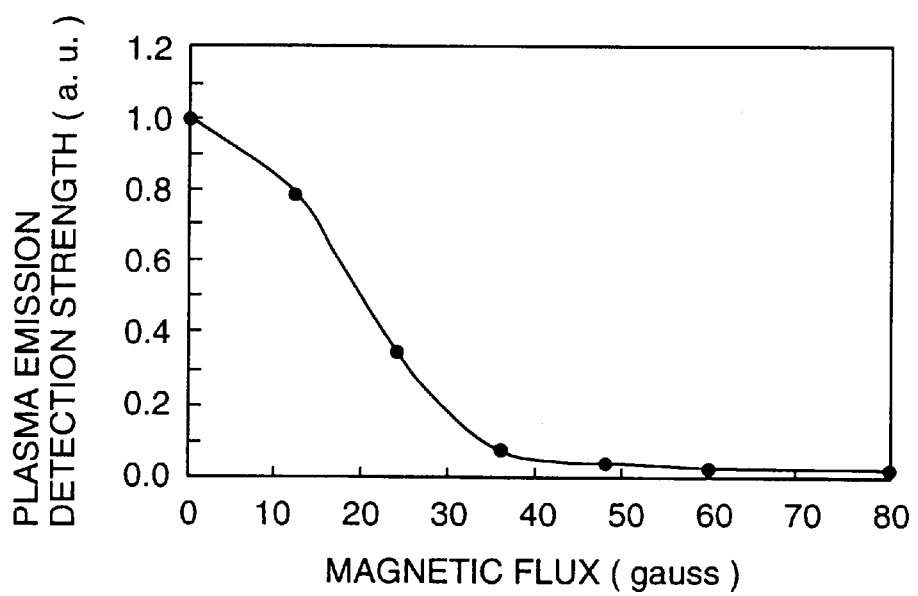
FIG. 4 is a graph showing experimental results of prevention of plasma diffusion into a hollow tube by a magnetic field, which is an essential point of the present invention.

FIG. 4 shows the experimental results. The magnetic field intensity (magnetic flux density) generated by the local magnetic field generation device 209 is indicated on the horizontal axis, and the detection intensity of plasma optical emission (Ar: 419.8 nm) measured by the optical emission measuring device 147B is indicated on the vertical axis. The detection intensity is standardized for the value in the case of a non-magnetic field. The results show that even in a comparatively weak magnetic field, such as 40 gauss, the optical emission intensity of plasma diffusing and entering in the direction of the depth of the hollow tube can be suppressed to about 10% of that in the case of a non-magnetic field, and when a magnetic field of 60 gauss is applied, it is reduced to about 2% or less, and the diffusion of plasma can be suppressed almost completely.

Figure 5:
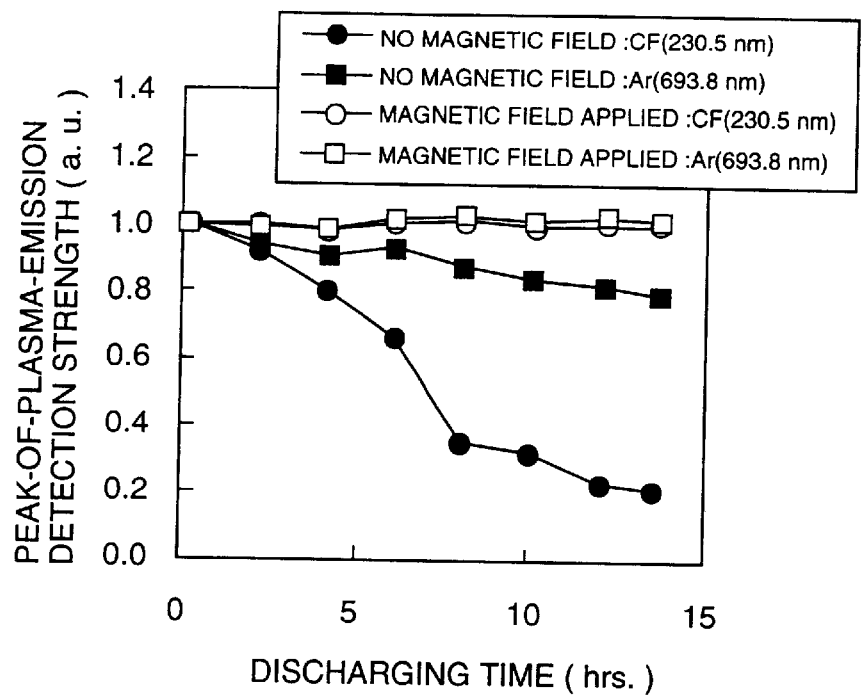
FIG. 5 is a graph showing experimental results of prevention of reduction in the transmission factor of a measuring window by a magnetic field, which is an essential point of the present invention.

Therefore, due to the effect of diffusion prevention of plasma into the hollow tube 142, the extent to which the reduction in the transmission factor of the measuring window is suppressed is evaluated using the experimental device shown in FIG. 3. In the experiment, the continuous discharge test is executed and the plasma optical emission intensity passing through the optical emission measuring window 143 is measured and compared depending on application of the magnetic field, that is, between a case wherein the magnetic field Bc is 0 gauss (no magnetic field is applied) and a case wherein a magnetic field of 60 gauss is applied. In FIG. 5, changes in the detection intensity of the optical emission-peak for the discharge time are shown. A case where no magnetic field is applied and a case where a magnetic field of 60 gauss is applied are shown in the drawing, and the optical emission detection intensities are 230.5 nm of CF and 693.8 nm of Ar respectively, and they are standardized by the optical emission intensities at the start of the continuous test (0 hours of discharge). In the case where no magnetic field is applied, both the detection intensities of 230.5 nm of CF and 693.8 nm of Ar are reduced, and, more particularly, the reduction in the detection intensity of 230.5 nm of CF on the short wave length side is remarkable. However, when a magnetic field is applied, both optical emission detection intensities of 230.5 nm of CF and 693.8 nm of Ar on the short wave length side can be kept constant for 15 hours of discharge. This shows that, due to the effect of plasma diffusion prevention by the magnetic field, the deposition of deposits onto the measuring window 143 can be suppressed almost completely.

Meanwhile, with respect to adhesion of reaction products and process gas onto the wall surface, it is generally known that, when the wall surface temperature rises, the adhesion rate of molecules reduces and the deposition rate reduces. However, deposition of a film is a kind of molecular polymerization reaction; and, for example, in the case of CF series process gas, the C—C bonding and C—F bonding form a network on a chain basis, and, hence, a deposited film is formed. The reaction is promoted due to assistance by electrons and ions in the plasma, and so the deposition rate increases. Namely, adhesion of deposits is greatly affected by the plasma density in addition to the temperature. This can be ascertained easily by tentatively attaching a mesh having many small holes of about 1 mm in diameter to the inlet of the hollow tube. Plasma cannot enter inside the hollow tube due to the mesh, and, at this time, the adhesion amount of a deposited film inside the hollow tube reduces greatly.

The relationship between the plasma density and the temperature to the film deposition rate can be considered from the adhesion condition of a deposited film inside the processing chamber shown in FIG. 2. The surface temperature of the dielectric ring 113 is about 120° C., though little deposits are formed. On the other hand, on the sample stage ring 132, although the saturation temperature rises up to about 250° C., deposits are formed, so that it is necessary to apply an appropriate bias voltage and remove the deposits. This can be considered to be caused by the fact that the plasma P is generated in the neighborhood right under the plate 115, and, although the plasma density is high in the neighborhood of the sample stage ring 132, the plasma density is comparatively low in the neighborhood of the dielectric ring 113. In the neighborhood of the outer edge of the antenna 111, the lines of magnetic force are almost perpendicular and electrons move along the lines of magnetic force and hardly move across the lines of magnetic force, so that the plasma is suppressed from diffusing toward the side wall due to the restraint effect by the magnetic field and are confined to the neighborhood under the antenna. Hence, there is an effect produced that the plasma density in this part is increased. These matters show clearly that the adhesion of deposits is not only a function of temperature, but also greatly depends on the plasma density.

In FIG. 2, the opening 141 or the hollow tube 142 and the lines of magnetic force B form an angle, and the magnetic field intensity is about 160 gauss, so that, unless a separate magnetic field generation means is newly installed, entry of plasma into the hollow tube 142 is limited only to the neighborhood of the inlet. As a result, the plasma assist reaction for a deposited film is suppressed, so that little deposited film will adhere to the inside of the hollow tube 142 and the measuring window 143. The angle formed by the hollow tube 142 and the lines of magnetic force B is 30 degrees to 45 degrees in the apparatus of the embodiment shown in FIG. 1, as shown in FIG. 2, though when the angle formed by the lines of magnetic force with the hollow tube is about 10 degrees or more, the effect of plasma entry prevention appears. When the angle formed by the hollow tube 142 and the lines of magnetic force B is desirably 30 degrees or more, the effect becomes more remarkable.

Figure 6:
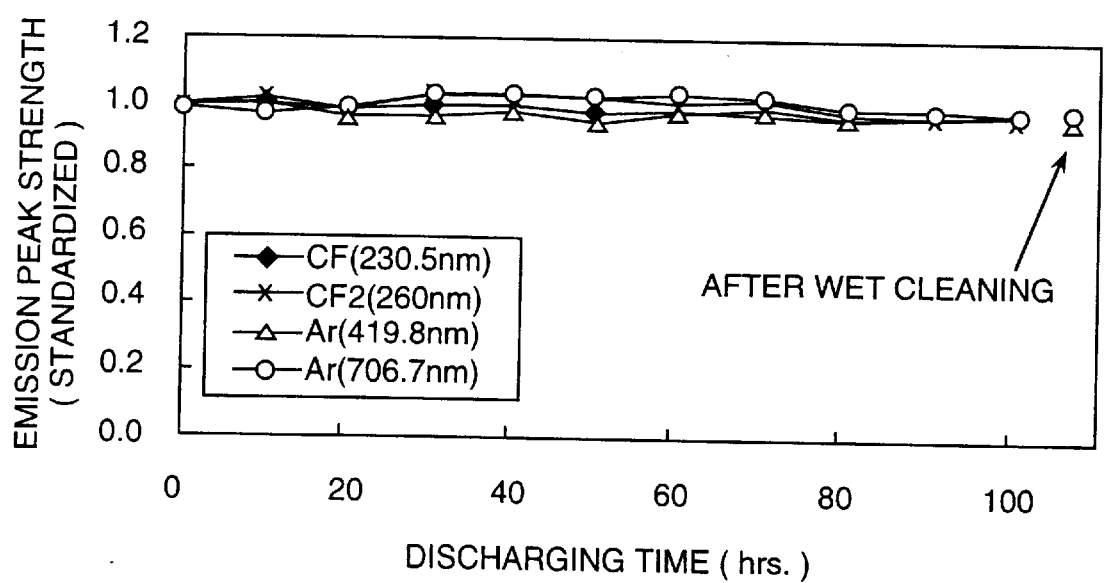
FIG. 6 is a graph showing results that it are experimentally verified by the continuous discharge test showing that the transmission factor of a measuring window does not change with discharge time in a plasma etching apparatus representing an embodiment of the present invention.

The effect of plasma entry prevention into the hollow tube by the magnetic field mentioned above is extremely remarkable. In the prior art, the plasma optical emission detection window cannot be prevented from getting fogged. According to the present invention, as shown in FIG. 5, the transmission factor of the measuring window 143 is not reduced during a period of 15 hours of discharge. This condition can be maintained, even if the discharge is continued by prolonging the discharge time, such as for several tens hours to 100 hours or more. The results experimentally ascertained are shown in FIG. 6. These results show that, in the apparatus of the embodiment shown in FIG. 1, there are changes with the discharge time of the detection intensity of the optical emission peak of 230.5 nm of CF, 260 nm of $CF_2$, 419.8 nm of Ar, and 706.7 nm of Ar, when a continuous test of the discharge time of 100 hours is executed, and the relationship with the discharge time is shown. In this continuous discharge test, the etching characteristics are reproduced satisfactorily through the test and the radical composition, composition ratio, and plasma condition are stable. Needless to say, the process of removing a deposited film inside the apparatus, such as plasma cleaning is not performed. No heating mechanism is installed in the optical emission measuring window, and the temperature of the side wall is about 50° C., and detection window is almost at the normal temperature.

As shown in FIG. 6, the detection intensity of the optical emission peak does not change over a period of 100 hours of discharge for CF, $CF_2$, and Ar. Particularly with the use of CF and $CF_2$, on the short wave length side at which they are sensitive to adhesion of deposits on the measuring window, no sign of reduction in the detection intensity can be seen. In the drawing, the results are shown in a case where the etching apparatus is exposed to air after a continuous test is finished, so as to perform wet cleaning, and then is evacuated once again, after which the reproducibility of the optical emission peak detection intensity is ascertained. In the wet cleaning, although deposits in the etching apparatus are all removed, no process is performed for the optical emission measuring window. In this case, it is found that the detection intensity of any optical emission peak has not changed before and after wet cleaning. Further, the detection intensity of the optical emission peak for CF, $CF_2$, and Ar does not change over a period of 100 hours of discharge and a much longer period, such as 1000 hours of discharges. This also shows clearly that no reaction products are deposited on the optical emission measuring window.

As described already, the prior art cannot suppress the reduction in the transmission factor of the optical emission measuring window completely and the optical emission detection intensity is reduced gradually. However, according to the present invention, even after a discharge time of 100 hours and much longer, such as 1000 hours, as mentioned above, no reduction in the transmission factor of the measuring window can be recognized. In this respect, the present invention has the effect of drawing a clear line from the prior art.

The advantage that the factor of reduction in the transmission factor of the optical emission measuring window can be removed almost completely as mentioned above is great. Firstly, to prevent the plasma optical emission detection intensity from reduction, it may be cited that the end point detection accuracy is not reduced with time. In addition, it is an advantage that the radical composition can be always determined accurately. For example, in oxide film etching using CF series gas, such as $C_4F_8$, the radical composition ratio such as CF, $CF_2$ or $C_2$ and F greatly affects the process characteristics. However, by always monitoring these optical emission intensities, a change with time of the plasma chemistry can be detected.

In FIG. 1, the plasma optical emission intensity is measured by the optical emission measuring device 147, and, on the basis of such measurement, for example, the calculation result of the optical emission intensity, such as the ratio of $CF_2/F$, $CF/F$, or $C_2/F$, is transferred to the system control means 149. At the same time, the system control means 149 monitors the values of Vpp and Vdc of the power source via the control interface 150, synthesizes these results, and detects changes in the condition inside the processing chamber. On the basis of this result, the system control means 149, for example, notifies a user of the timing of wet cleaning, or, more positively, outputs an instruction so as to control the process conditions, for example, the output of the antenna power system 120 and the bias power source 134, or the intensity and distribution of the magnetic field generated by the magnetic field forming means 101, or the flow rate and composition ratio of gas fed from the gas feed means 116, or the pressure control means 105, for example, so as to make the ratios of $CF_2/F$, $CF/F$, and $C_2/F$ of the optical emission intensity constant, for purposes of stabilizing the etching characteristics. As mentioned above, the present invention can provide a more advanced process control method by quantitatively monitoring the radical composition and can provide a plasma processing apparatus for improving the reproducibility and stability of the processing, while also contributing to improvement of the operation rate and productivity of the apparatus.

The aforementioned embodiments all indicate a plasma processing apparatus using a magnetic field UHF band electromagnetic wave radiation-discharge system. However, electromagnetic waves to be radiated, in addition to the UHF band, may be, for example, a microwave of 2.45 GHz or the VHF band from several tens of MHz to about 300 MHz. With respect to the magnetic field intensity, a case of 160 gauss, which is an electron cyclotron resonance magnetic field intensity for 450 MHz is employed. However, there is no need to use a resonance magnetic field always, and a magnetic field stronger than it or a weak magnetic field of several tens of gauss or more may be used. In a magnetron type plasma processing apparatus using a magnetic field, the magnetic field may be almost parallel with the electrodes between the electrodes. However, in the neighborhood of the side wall, the lines of magnetic force form an angle with the electrode surface, so that the present invention can be applied in the same way.

In the aforementioned embodiments, the object to be processed is a semiconductor wafer, and the etching process for it is described. However, the present invention is not limited thereto and can be applied also to a case in which the object to be processed is, for example, a liquid crystal substrate and the processing itself is not limited to etching. The present invention can be also applied to, for example, sputtering or CVD processing.

As explained above, according to the present invention, when the hollow tube is installed at the opening installed on the side wall of the processing chamber, and the plasma optical emission measuring window is attached to the top thereof, and the magnetic field is formed so that the hollow tube and line of magnetic force form an angle, entry of plasma into the hollow tube is prevented and adhesion of deposits on the measuring window can be suppressed, and, hence, the transmission factor of the measuring window is not reduced with time, but is kept constant, and plasma optical emission can be measured stably and accurately for many hours. As a result, the accuracy of end point detection of the etching process can be kept stable unless it reduces with time. Furthermore, more advanced process control, such as quantitatively monitoring the radical composition and controlling the process conditions, can be executed, so that the present invention can provide a plasma processing apparatus for improving the reproducibility and stability of the processing, while contributing to improvement of the productivity.

What is claimed is:

1. A plasma processing apparatus of a magnetic field UHF electromagnetic wave radiation system structured so as to feed process gas into a vacuum processing chamber, generate plasma by a plasma generation device, perform a plasma process for a sample by said plasma, and measure optical emission from said plasma via a measuring window, wherein a hollow tube is installed in communication with said processing chamber so as to extend from an opening of said processing chamber in an outer direction, and said measuring window is installed at an outside end of said hollow tube, and a magnetic field is formed in the neighborhood of said opening of said processing chamber which forms an inlet of said hollow tube in said processing chamber so that lines of magnetic force form an angle relative to an axis of said hollow tube and extend in a substantially vertical direction with respect to said processing chamber.

2. The plasma processing apparatus according to claim 1, wherein an inner diameter of said hollow tube is within a range from 2 mm to 10 mm and the length thereof is within a range from 50 mm to 250 mm.

3. The plasma processing apparatus according to claim 1, wherein said magnetic field formed in said neighborhood of said opening of said processing chamber forming said inlet of said hollow tube has a magnetic flux density of at least 60 gauss.

4. The plasma processing apparatus according to any one of claims 1 to 3, wherein said angle formed by said lines of magnetic force relative to said axis of said hollow tube is at least 30 degrees.

5. The plasma processing apparatus according to claim 1, wherein the opening of said processing chamber is in a sidewall of said processing chamber, and the structure of the plasma processing apparatus substantially prevents entry of plasma from said processing chamber into said hollow tube and substantially suppresses adhesion of deposits onto said measuring window so that a transmission factor of said measuring window is maintained constant for an extended period of processing in said processing chamber.

6. A plasma processing apparatus of a magnetic field UHF band electromagnetic wave radiation system structured so as to feed process gas into a vacuum processing chamber, generate plasma by a plasma generation device, perform a plasma process for a sample by said plasma, and measure optical emission from said plasma via a measuring window;

wherein a hollow tube is installed in communication with said processing chamber so as to extend from an opening of said processing chamber in an outer direction, and said measuring window is installed at an outside end of said hollow tube;

said hollow tube having an inner diameter and a length thereof in relation to a mean free path of molecules of said process gas which is set so that
(the inner diameter)/(the mean free path of molecules) is within a range from 0.1 to 2,
(the length)/(the mean free path of molecules) is within a range from 2 to 50, and
(the length)/(the inner diameter) is within a range from about 25 to 50; and said magnetic field is formed such that magnetic force lines extend in the neighborhood of an inlet of said hollow tube at an angle in relation to an axis of said hollow tube and in a substantially vertical direction with respect to the processing chamber.

7. The plasma processing apparatus according to claim 5, wherein the opening of said processing chamber is in a sidewall of said processing chamber, and the structure of the plasma processing apparatus substantially prevents entry of plasma from said processing chamber into said hollow tube and substantially suppresses adhesion of deposits onto said measuring window so that a transmission factor of said measuring window is maintained constant for an extended period of processing in said processing chamber.

* * * * *